United States Patent
Shiga et al.

(10) Patent No.: US 7,269,049 B2
(45) Date of Patent: Sep. 11, 2007

(54) FERROELECTRIC RANDOM ACCESS MEMORY DEVICE

(75) Inventors: Hidehiro Shiga, Kamakura (JP);
Shinichiro Shiratake, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 11/046,878

(22) Filed: Feb. 1, 2005

(65) Prior Publication Data

US 2006/0023484 A1   Feb. 2, 2006

(30) Foreign Application Priority Data

Jul. 28, 2004   (JP) .............................. 2004-220663

(51) Int. Cl.
  *G11C 11/22*   (2006.01)
(52) U.S. Cl. ..................... 365/145; 365/205; 365/207
(58) Field of Classification Search ................ 365/145, 365/205, 207
See application file for complete search history.

(56) References Cited

U.S. PATENT DOCUMENTS 6,980,458 B2 * 12/2005 Demange et al. ........... 365/145

FOREIGN PATENT DOCUMENTS

| JP | 2002-32984 | 1/2002 |
|---|---|---|
| JP | 2002-133857 | 5/2002 |

OTHER PUBLICATIONS

Shoichiro Kawashima, "Bitline GND Sensing Technique for Low-Voltage Operation FeRAM", IEEE Journal of Solid-State Circuits, vol. 37, No. 5, May 2002, pp. 592-598.

\* cited by examiner

*Primary Examiner*—Huan Hoang
(74) *Attorney, Agent, or Firm*—Oblon, Spivak, McClelland, Maier & Neustadt, P.C.

(57) ABSTRACT

A plurality of ferroelectric memory cells is arrayed. One terminal of each memory cells arrayed in the same column is connected in common to a first bit line. A gate of a transistor of memory cells arrayed in the same row is connected in common to a word line. The other terminal of each of memory cells arrayed in the same column or the same row is connected in common to a cell plate line. A second bit line is connected with a reference voltage supply circuit. The first and second bit lines are connected with a data read circuit. The data read circuit includes a sense amplifier and a current mirror circuit having a pair of current input node connected to the first and second bit lines, and carrying the same current flowing through one of the first and second bit line to the other bit line.

20 Claims, 7 Drawing Sheets

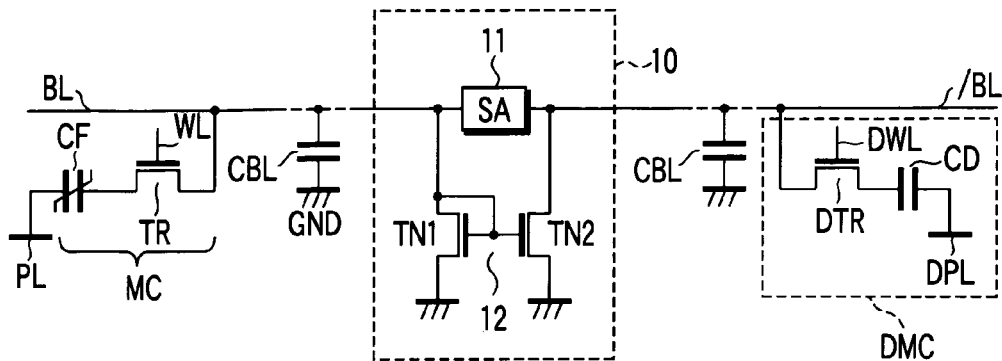
F I G. 1
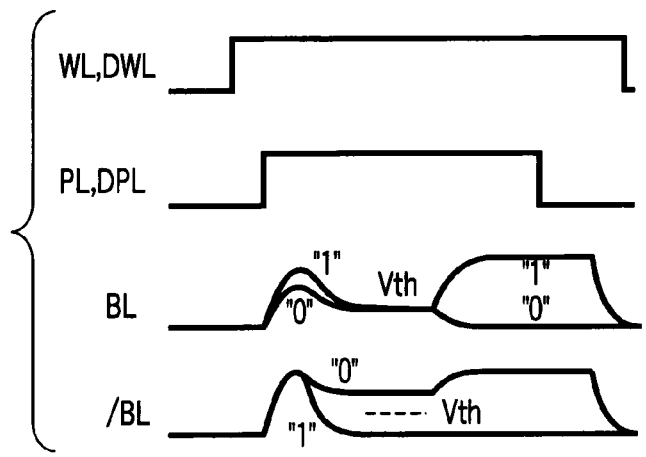
F I G. 2
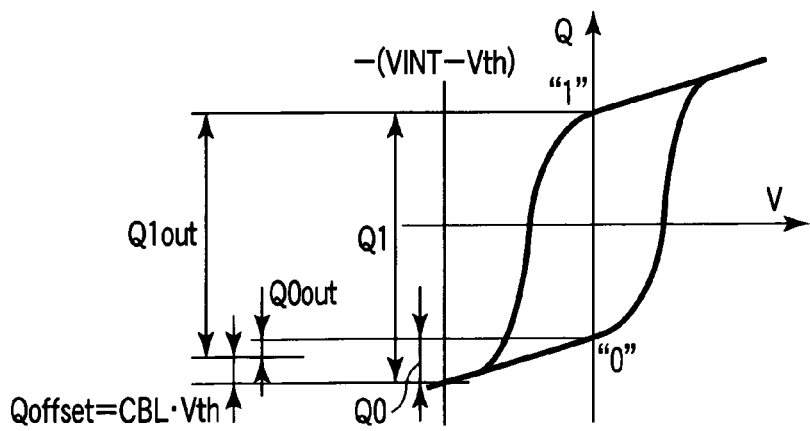
F I G. 3

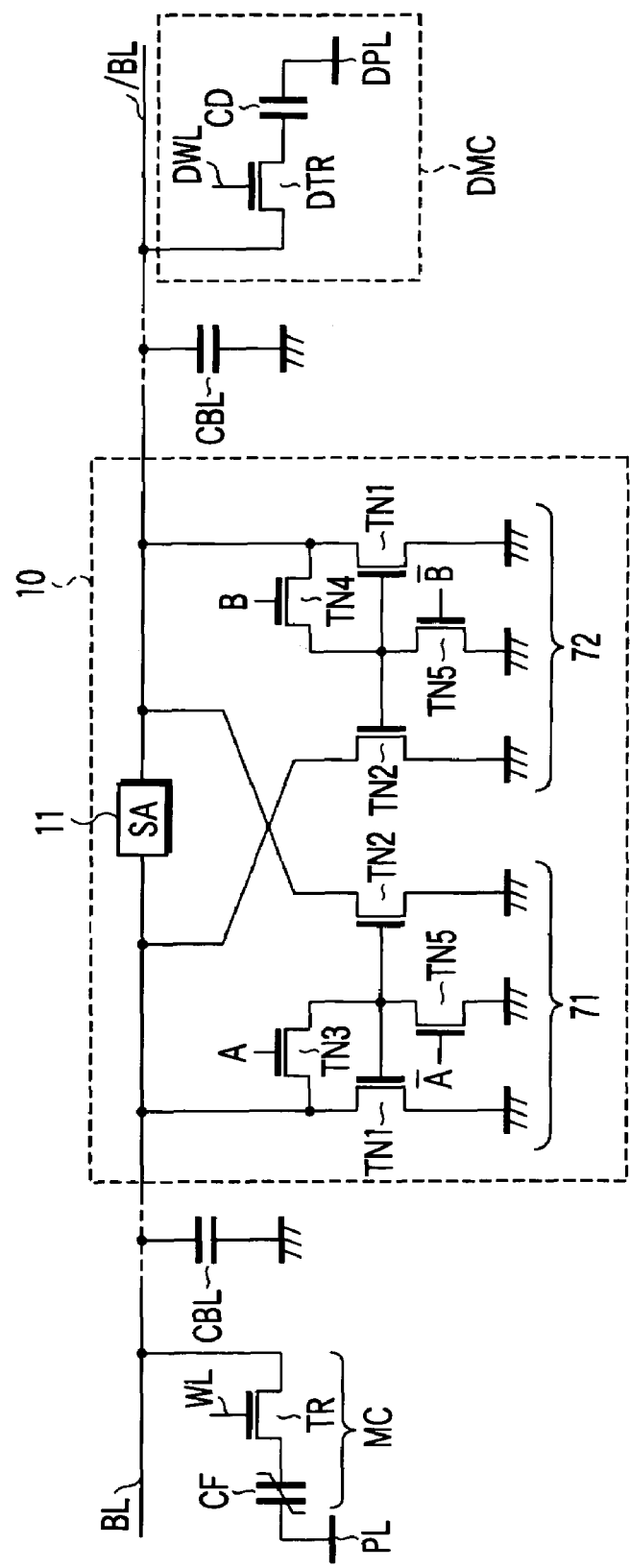
F I G. 6

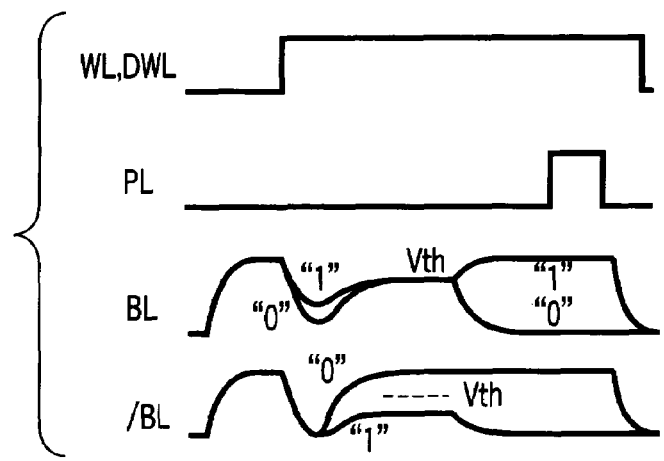
F I G. 9
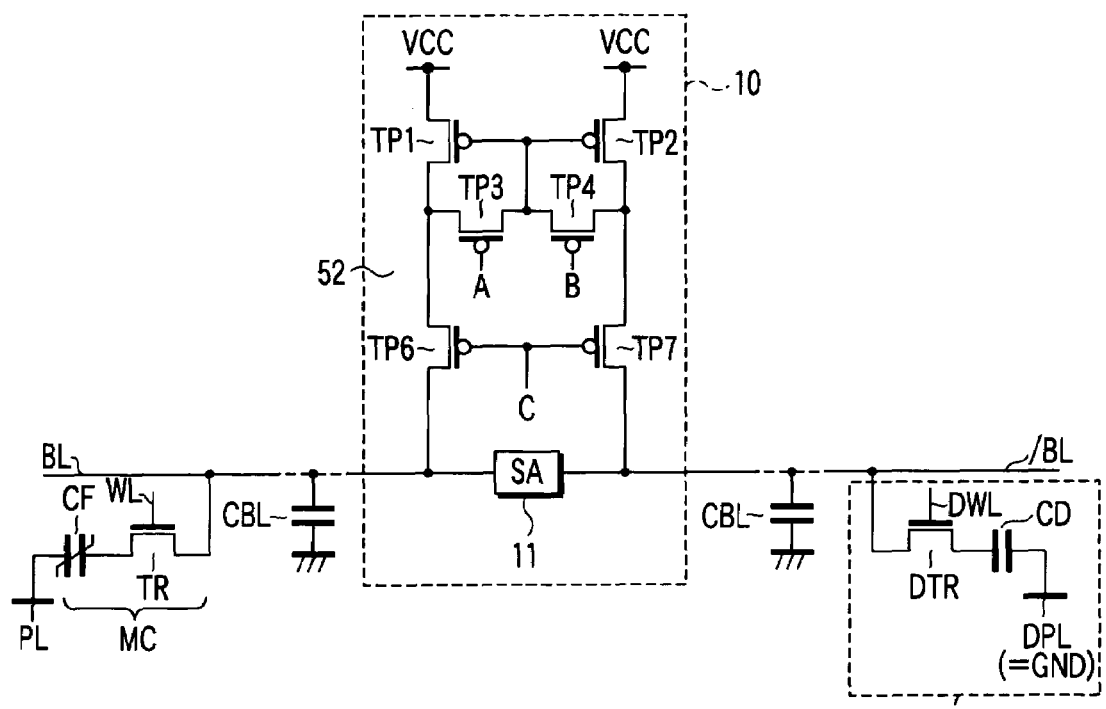
F I G. 10

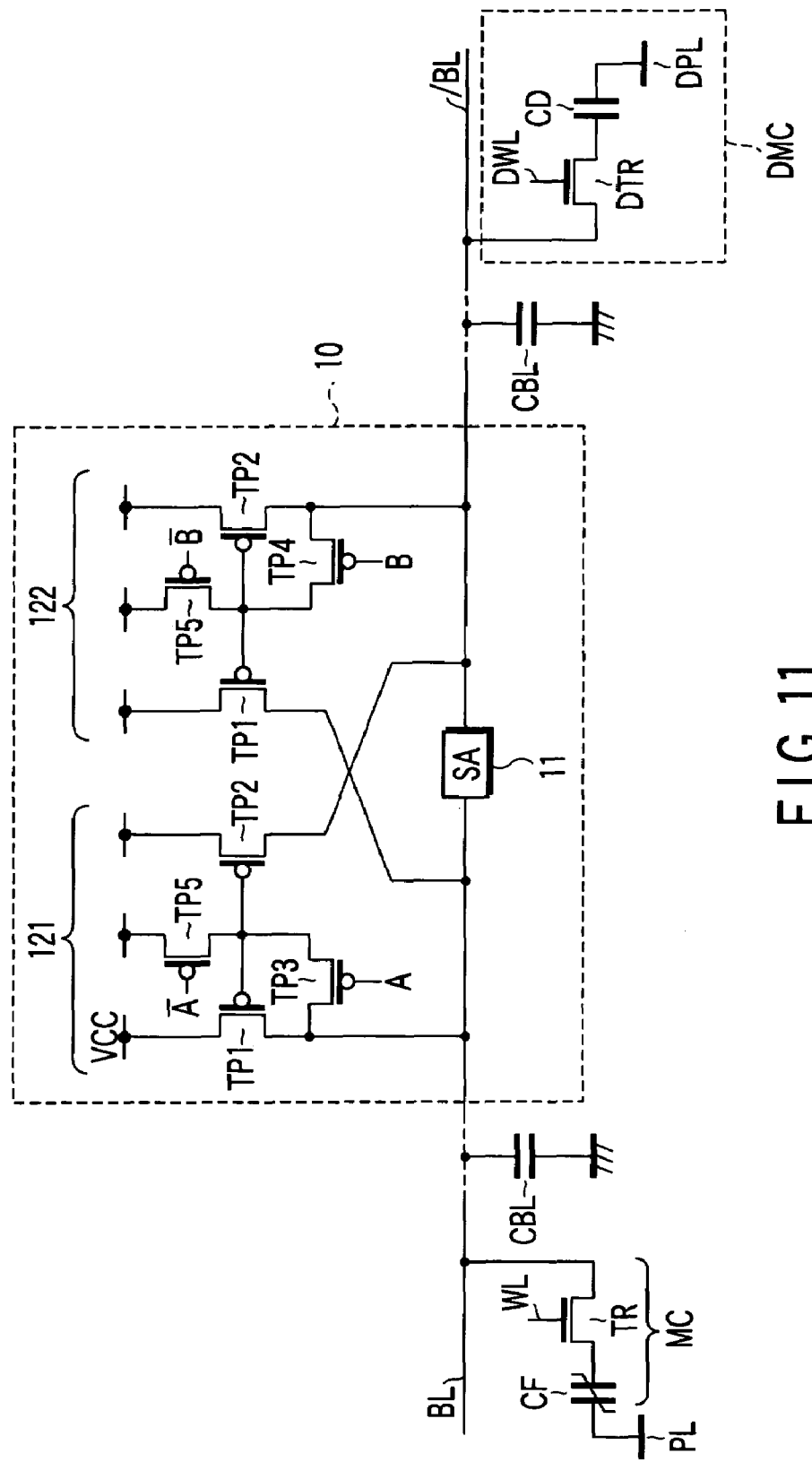
F I G. 11

FERROELECTRIC RANDOM ACCESS MEMORY DEVICE

CROSS-REFERENCE TO RELATED APPLICATIONS

This application is based upon and claims the benefit of priority from prior Japanese Patent Application No. 2004-220663, filed Jul. 28, 2004, the entire contents of which are incorporated herein by reference.

BACKGROUND OF THE INVENTION

1. Field of the Invention

The present invention relates to a ferroelectric random access memory device, and in particular, to a data read circuit.

2. Description of the Related Art

A memory device having a one-transistor/one-capacitor ferroelectric memory cell is given as one example of a ferroelectric random access memory device. The one-transistor/one-capacitor ferroelectric memory cell memory device includes one charge transfer gate MOS transistor and one ferroelectric capacitor, which are series-connected. Various types are given as a data read circuit for reading data from the ferroelectric memory cell. In general, the ferroelectric capacitor has a hysteresis characteristic between voltage and charge relationship. The following document has disclosure that when an imprint phenomenon occurs in hysteresis characteristic, a signal of data "1"/"0" read to a bit line from the ferroelectric memory cell changes.

Document: S. Kawashima, T. Endo, A. Yamamoto, K. Nakabayashi, M. Nakazawa, K. Morita and M. Aoki, "Bit-line GND sensing technique for low-voltage operation FeRAM", IEEE Journal of Solid-State Circuits, volume: 37, Issue: 5, May 2002, pp. 592-598.

On the other hand, there has been known a charge transfer type as the data read circuit of the conventional ferroelectric memory device. The charge transfer type data read circuit transfers a charge read from the ferroelectric memory cell to a bit line to a sense amplifier via a transfer PMOS transistor and coupling capacitor.

The charge transfer type data read circuit has almost no signal change by the imprint phenomenon occurring in the ferroelectric capacitor. In particular, when the ferroelectric capacitor having ideal parallelogram hysteresis characteristic (loop), there is almost no generation of signal change by the imprint phenomenon. However, the data read circuit has a need to generate a negative voltage supplied to the gate of a charge transfer PMOS transistor. In addition, the structure adaptable to the negative voltage must be employed. For this reason, the circuit configuration and process become troublesome.

Moreover an output data of the sense amplifier connected to the bit line is inverted with respect to data read from the memory cell to the bit line. For this reason, circuit connection and control for writing and rewiring the output data of the sense amplifier to the memory cell become complicated.

A double bit line type data read circuit also proposed, which is disclosed in JPN. PAT. APPLN. KOKAI Publication No. 2002-32984. In the foregoing ferroelectric memory device, a sub-bit line connected with several ferroelectric memory cells is connected to the bit line via a current mirror circuit. A data read circuit of the ferroelectric memory device has the following configuration. More specifically, a pair of current input nodes of a first current mirror circuit is connected correspondingly to a first sub-bit line and a first bit line. Likewise, a pair of current input nodes of a second current mirror circuit is connected correspondingly to a second sub-bit line and a second bit line. The voltage of the first and second bit lines is supplied to a pair of input nodes of the sense amplifier.

However, in also case of the double bit line type data read circuit, the output data of the sense amplifier connected to the bit line is inverted with respect to data read from the memory cell to the bit line. For this reason, circuit connection and control for rewriting the output data of the sense amplifier to the memory cell become complicated.

BRIEF SUMMARY OF THE INVENTION

According to an aspect of the present invention, there is provided a ferroelectric random access memory device comprising:

a memory cell array having a plurality of ferroelectric memory cells in a matrix, each including a transistor for charge transfer gate;

a first bit line connected to one terminals of the plurality of ferroelectric memory cells;

a word line connected to gates of the transistors of the plurality of ferroelectric memory cells;

a cell plate line connected to the other terminals of the plurality of ferroelectric memory cells;

a second bit line paring with the first bit line;

a reference voltage supply circuit connected to the second bit line, and supplying a reference voltage to the second bit line; and a data read circuit connected to the first and second bit lines, the data read circuit including:

a sense amplifier having a pair of sense nodes connected to the first and second bit lines, and comparing and amplifying each voltage of the first and second bit lines; and a current mirror circuit having a pair of current input node or a pair of current output node connected to the first and second bit lines, and carrying the same current flowing through one of the first and second bit line to the other bit line.

BRIEF DESCRIPTION OF THE SEVERAL VIEWS OF THE DRAWING

FIG. 1 is a circuit diagram of a ferroelectric memory device according to a first embodiment of the present invention;

FIG. 2 is a timing waveform chart showing principal signals in the ferroelectric memory device shown in FIG. 1;

FIG. 3 is a characteristic chart of the ferroelectric memory device shown in FIG. 1;

FIG. 6 is a circuit diagram of a ferroelectric memory device according to a third embodiment of the present invention;

FIG. 9 is a timing waveform chart showing principal signals in the ferroelectric memory device shown in FIG. 8;

FIG. 10 is a circuit diagram showing a modification example of the ferroelectric memory device shown in FIG. 8;

FIG. 11 is a circuit diagram of a ferroelectric memory device according to a fifth embodiment of the present invention.

DETAILED DESCRIPTION OF THE INVENTION

Figure 4:
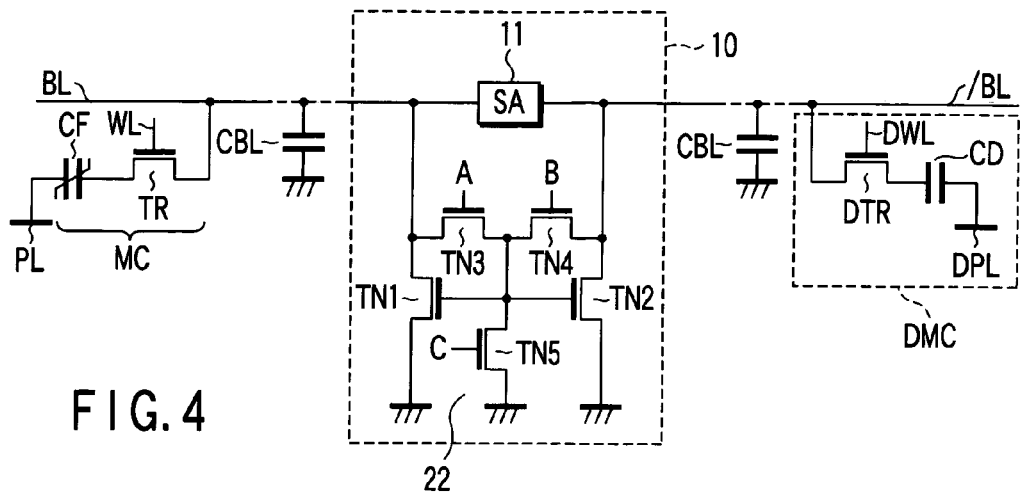
FIG. 4 is a circuit diagram of a ferroelectric memory device according to a second embodiment of the present invention.

Embodiments of the present invention will be described below with reference to the accompanying drawings. In the following description, the same reference numerals are used to designate corresponding portions over all drawings, and the overlapping explanation is omitted.

FIRST EMBODIMENT

FIG. 1 shows the partial configuration of a ferroelectric memory device according to a first embodiment of the present invention. The ferroelectric memory device is provided with a plurality of one-transistor/one-capacitor ferroelectric memory cells MC. Each of the plurality of one-transistor/one-capacitor ferroelectric memory cells MC is composed of one MOS transistor TR for charge transfer gate and one ferroelectric capacitor CF, which are series-connected. A memory cell array is formed in a manner that these memory cells MC are arrayed like a matrix. In FIG. 1, there is shown one memory cell MC included in the memory cell array. In the memory cell array, each one terminal of the same column memory cells MC, that is, the drain of the MOS transistor TR is connected in common to a bit line BL. In the memory cell array, the gate of the MOS transistor TR of the same row memory cells MC is connected to a word line WL in common. The source of the MOS transistor TR is connected to one terminal of the corresponding ferroelectric capacitor CF. The other terminal of each ferroelectric capacitor CF of the same column memory cells or the same row memory cells MC is connected in common to a cell plate line PL. Parasitic capacitance also exists between the bit line BL and the ground voltage (GND), and is denoted by CBL in FIG. 1.

Parasitic capacitance also exists between a bit line /BL paired with the foregoing bit line BL and the ground voltage (GND), and is also denoted by CBL in FIG. 1. The bit line /BL is connected with a dummy memory cell DMC, which functions as a reference voltage supply circuit for generating a reference voltage. The dummy memory cell DMC supplies the reference voltage to the bit line /BL at predetermined timing. The dummy memory cell DMC includes a dummy cell transistor DTR and a dummy capacitor CD. The drain of the dummy cell transistor DTR is connected to the bit line /BL while the source thereof is connected with one terminal of the dummy capacitor CD. The other terminal of the dummy capacitor CD is connected to a dummy cell plate line DPL. The gate of the dummy cell transistor DTR is connected to a dummy word line DWL.

Although not illustrated in FIG. 1, the bit line BL is actually connected with a dummy memory cell DMC, and another bit line /BL is connected with a plurality of memory cells MC.

The bit line pair BL and /BL is connected with a data read circuit 10. The data read circuit 10 includes a sense amplifier (SA) 11 and a current mirror circuit 12. The sense amplifier 11 has a pair of sense nodes with respect to the bit line pair BL and /BL, and compares and amplifies the voltage of the paired bit line. The current mirror circuit 12 has a function of carrying the same current as flowing through one of the bit line pair BL and /BL, for example, the bit line BL, to the other bit line /BL.

As seen from FIG. 1, the current mirror circuit 12 has first and second NMOS transistors TN1 and TN2. The first NMOS transistor TN1 has drain and gate connected to one bit line BL and source connected to the GND node. The second NMOS transistor TN2 has a drain connected to the other bit line /BL, a gate connected to the gate of the first NMOS transistor TN1, that is, one bit line BL, and a source connected to the GND node. The transistors TN1 and TN2 have the same characteristic.

In the data read circuit 10, the sense amplifier 11 compares and amplifies the following bit line voltages. One is a bit line voltage depending on a signal read from the memory cell MC connected to one bit line BL. Another is a bit line voltage depending on the reference voltage generated by the dummy memory cell DMC connected to the other bit line /BL. Basically, the current mirror circuit 12 makes an operation of carrying out the same charge as carried from the bit line BL, from the reference bit line /BL. In other words, the current mirror circuit 12 carries the same current as carried from the bit line BL to the reference bit line /BL. In the operation mode of the sense amplifier 11 and the standby mode of the device, the current mirror circuit 12 is preferably set to an off state.

The operation of the memory device shown of FIG. 1 will be described below. FIG. 2 is a timing waveform chart showing principal signals in the memory device of FIG. 1. Here, BL is used as a read bit line on the data read side, and /BL is used as a reference bit line for reference.

When a memory cell is selected in a state that the word line WL is set to "H", the ferroelectric capacitor CF of the selected memory cell is connected to the bit line BL. Simultaneously, the dummy word line DWL is set to "H" to select the dummy memory cell DMC; therefore, the dummy capacitor CD of the dummy memory cell DMC is connected to the reference bit line /BL.

In this state, the voltages of the cell plate line PL and dummy plate line DPL are stepped up. By doing so, the voltage of the bit line BL steps up in accordance with a capacitance ratio of the ferroelectric capacitor CF of the selected memory cell MC and the bit line capacitance CBL. Likewise, the voltage of the reference bit line /BL steps up in accordance with a capacitance ratio of the dummy capacitor CD of the selected dummy memory cell DMC and the reference bit line capacitance CBL.

When the bit line voltage exceeds a threshold voltage Vth of the transistor TN1, a current flows to the GND node through the transistor TN1 from the bit line BL. The current continues to flow until the bit line voltage drops, and reaches the threshold voltage Vth of the transistor TN1. In this case, the transistors TN1 and TN2 forming the current mirror circuit 12 have the same characteristic; therefore, the same current as flowing through the transistor TN1 flows through the transistor TN2. In other words, the same charge as carried from the bit line BL is carried out from the reference bit line /BL.

FIG. 3 shows the relationship between the voltage/charge holding characteristic of the ferroelectric capacitor CF of the selected memory cell MC and a charge of data "1"/"0" read to bit line from memory cell in the data read circuit 10 of FIG. 1.

A voltage VINT-Vth is supplied between both terminals of the ferroelectric capacitor CF of the selected memory cell MC. In this case, VINT is a voltage of the cell plate line PL, which steps up from 0 V, and Vth is a threshold voltage of the transistor TN1. When the foregoing voltage is supplied, a charge Q1 or Q0 is carried into the bit line BL from the ferroelectric capacitor CF in accordance with data "1" or "0". In the charge, a charge Qoffset stored in the bit line BL is CBL×Vth, and the remaining charge, that is, Q1*out* or Q0*out* flows to the GND node via the transistor TN1. In this case, the capacitance of the dummy capacitor CD and the voltage of the dummy cell plate line DPL are set to a proper value. By doing so, a relation of bit line voltage<reference bit line voltage is given in the data "0" read while a relation of bit line voltage>reference bit line voltage is given in the data "1" read.

The sense amplifier 11 compares the bit line voltage depending on a signal read from the memory cell MC connected to one bit line BL with the bit line voltage depending on the reference voltage generated by the dummy memory cell DMC connected to the other bit line /BL, and then, amplifies these voltages. During the "H" period of the word line WL, the output of the sense amplifier 11 is transferred to the ferroelectric capacitor CF of the selected memory cell via the bit line BL. By doing so, data is rewritten to the memory cell MC.

In the memory device according to the first embodiment, data read is stably achieved with respect to the imprint phenomenon of the ferroelectric memory cell. Therefore, data write to the ferroelectric memory cell is realized using a simple circuit.

SECOND EMBODIMENT

FIG. 4 shows a memory device according to a second embodiment of the present invention. A data read circuit 10 shown in FIG. 4 is provided with a current mirror 22, which includes first to fifth NMOS transistors TN1 to TN5. The drain-source current path of the first NMOS transistor TN1 is connected between one bit line BL and the GND node. The drain-source current path of the second NMOS transistor TN2 is connected between the other bit line /BL and the GND node. The gate of the first and second NMOS transistors TN1 and TN2 is connected in common. The drain-source current path of the third NMOS transistor TN3 is connected between one bit line BL and a gate common connection node of the first and second NMOS transistors TN1 and TN2. The drain-source current path of the fourth NMOS transistor TN4 is connected between the other bit line /BL and the gate common connection node of the first and second NMOS transistors TN1 and TN2. The drain-source current path of the fifth NMOS transistor TN5 is connected between the gate common connection node of the first and second NMOS transistors TN1 and TN2 and the GND node. The gate of the third NMOS transistor TN3 is supplied with a first control signal A. The gate of the fourth NMOS transistor TN4 is supplied with a second control signal B. The gate of the fifth NMOS transistor TN5 is supplied with a third control signal C.

The timing waveform chart of principal signals in the memory device shown in FIG. 4 is the same as FIG. 2. In the data read circuit 10 shown in FIG. 4, the sense amplifier 11 compares and amplifies the following bit line voltages. One is a bit line voltage depending on a signal read from the memory cell MC connected to one of bit line pair BL and /BL. Another is a bit line voltage depending on the reference voltage generated by the dummy memory cell DMC connected to the other bit line.

When the bit line BL is used as a read bit line while the bit line /BL is used as a reference bit line, the transistor TN3 is driven on while transistors TN4 and TN5 are driven off according to the foregoing control signals A, B and C. By doing so, the drain-gate of the first NMOS transistor TN1 is short-circuited. Thus, the current mirror circuit 22 has the same circuit configuration as the current mirror circuit 12 shown in FIG. 1. Consequently, the same current as carried from the read bit line BL is carried to the current mirror circuit 22 from the reference bit line /BL, like the memory device of FIG. 1.

Conversely, when the bit line /BL is used as a read bit line while the bit line BL is used as a reference bit line, the transistor TN4 is driven on while transistors TN3 and TN5 are driven off according to the foregoing control signals A, B and C. By doing so, the same current as carried from the read bit line /BL is carried to the current mirror circuit 22 from the reference bit line BL.

When the sense amplifier 11 is in an operation mode and the device is in a standby mode, the transistor TN5 is driven on while transistors TN3 and TN4 are driven off according to the foregoing control signals A, B and C. By doing so, the gate of the transistors TN1 and TN2 is supplied with a ground voltage; therefore, both transistors TN1 and TN2 become an off state. As a result, the bit line pair BL and /BL are separated from the GND node.

During the "H" period of the word line WL, the amplified output of the sense amplifier 11 is transferred to the ferroelectric capacitor of the selected memory cell via the bit line BL or /BL. By doing so, data is rewritten.

MODIFICATION EXAMPLE OF SECOND EMBODIMENT

Figure 5:
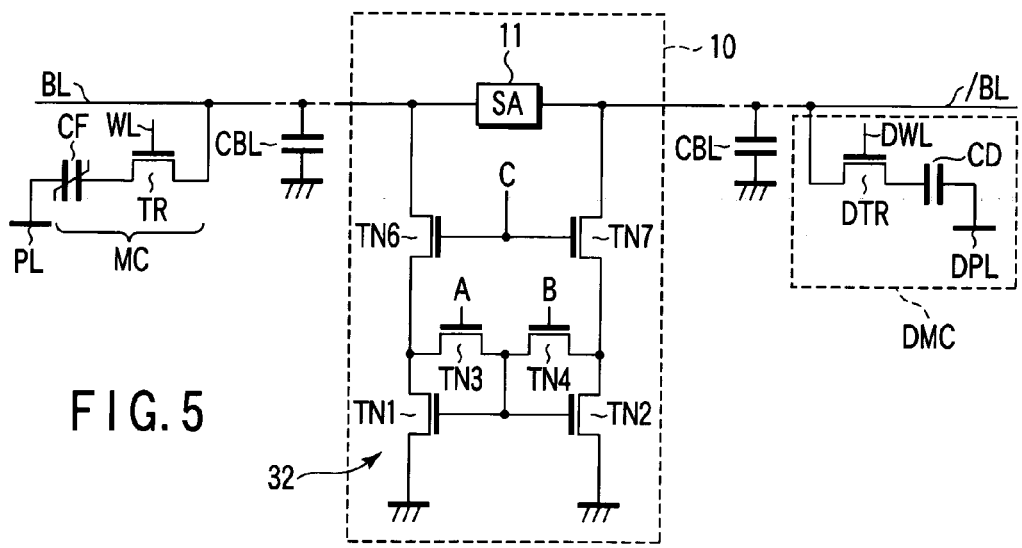
FIG. 5 is a circuit diagram showing a modification example of the ferroelectric memory device shown in FIG. 4.

FIG. 5 shows a modification example of the memory device shown in FIG. 4. A current mirror circuit 32 shown in FIG. 5 differs from the current mirror circuit 22 shown in FIG. 4 in the circuit configuration for driving off transistors TN1 and TN2. More specifically, the drain-source current path of the NMOS transistor TN6 is connected between the bit line BL and the drain of the transistor TN1. The drain-source current path of the NMOS transistor TN7 is connected between the bit line /BL and the drain of the transistor TN2. Each gate of the transistors TN6 and TN7 is supplied with the control signal C.

In the memory device of FIG. 5, when the bit line BL is used as a read bit line while the bit line /BL is used as a reference bit line, the transistors TN3, TN6 and TN7 are each driven on while transistors TN4 is driven off according to the foregoing control signals A, B and C. By doing so, the drain-gate of the first NMOS transistor TN1 is short-circuited. Thus, the current mirror circuit 32 has the same circuit configuration as the current mirror circuit 12 shown in FIG. 1. Consequently, in the current mirror circuit 32, the same current as carried from the read bit line BL is carried from the reference bit line /BL.

Conversely, when the bit line /BL is used as a read bit line while the bit line BL is used as a reference bit line, the transistors TN4, TN6 and TN7 are each driven on while transistor TN3 is driven off according to the foregoing control signals A, B and C. By doing so, the same current as carried from the read bit line /BL is carried to the current mirror circuit 32 from the reference bit line BL.

Incidentally, when the sense amplifier 11 is in an operation mode and the device is in a standby mode, the transistors TN6 and TN7 are driven off, and thereby, the bit lines BL and /BL are separated from the GND node.

THIRD EMBODIMENT

FIG. 6 shows a memory device according to a third embodiment of the present invention. A data read circuit 10 is provided with first and second current mirror circuits 71 and 72. The first current mirror circuit 71 carries the same current as carried from the bit line BL from the bit line /BL. On the other hand, the second current mirror circuit 72 carries the same current as carried from the bit line /BL from the bit line BL.

The first current mirror circuit 71 includes four NMOS transistors TN1, TN2, TN3 and TN5. The gate of the transistor TN3 is supplied with the control signal A. The gate of the transistor TN5 is supplied with an inverted signal /A of the control signal A.

The second current mirror circuit 72 includes four NMOS transistors TN1, TN2, TN4 and TN5. The gate of the transistor TN3 is supplied with the control signal B. The gate of the transistor TN5 is supplied with an inverted signal /B of the control signal B.

In the memory device of FIG. 6, one of the foregoing two current mirror circuits 71 and 72 is operated in accordance with two control signals A and B. In other words, the memory device of FIG. 6 is operated in the same manner as the memory device of FIG. 4.

When the bit line BL is used as a read bit line while the bit line /BL is used as a reference bit line, the control signal A is set to "H" while the control signal B is set to "L". In the first current mirror circuit 71, the transistor TN3 is driven on while the transistor TN5 is driven off. On the other hand, the second current mirror circuit 72, the transistor TN4 is driven off while the transistor TN5 is driven on. By doing so, the first current mirror circuit 71 is operated, and the same current as carried from the read bit line BL is carried to the first current mirror circuit 71 from the reference bit line /BL.

Conversely, when the bit line /BL is used as a read bit line while the bit line BL is used as a reference bit line, the control signal A is set to "L" while the control signal B is set to "H". In the first current mirror circuit 71, the transistor TN3 is driven off while the transistor TN5 is driven on. On the other hand, the second current mirror circuit 72, the transistor TN4 is driven on while the transistor TN5 is driven off. By doing so, the second current mirror circuit 72 is operated, and the same current as carried from the read bit line /BL is carried to the second current mirror circuit 72 from the reference bit line BL.

Incidentally, when the sense amplifier 11 is in an operation mode and the device is in a standby mode, both control signals A and B are set to "L". In the first and second current mirror circuits 71 and 72, the transistors TN3 and TN4 are both driven off while the transistors TN5 are driven on. Thus, the bit lines BL and /BL are separated from the GND node in the first and second current mirror circuits 71 and 72.

According to the third embodiment, the paired transistors TN1 and TN2 included in the current mirror circuits 71 and 72 may differ from each other in its size, thereby obtaining gain.

For example, when the channel width of the transistor TN2 is set to n times as wide as that of the transistor TN1, in the data read operation, the charge carried from the reference bit line is amplified to n times as much as that carried from the read bit line. Therefore, this serves to widen the setting margin in the capacitance value of the dummy capacitor CD and the voltage of the dummy cell plate line DPL.

MODIFICATION EXAMPLE OF THIRD EMBODIMENT

Figure 7:
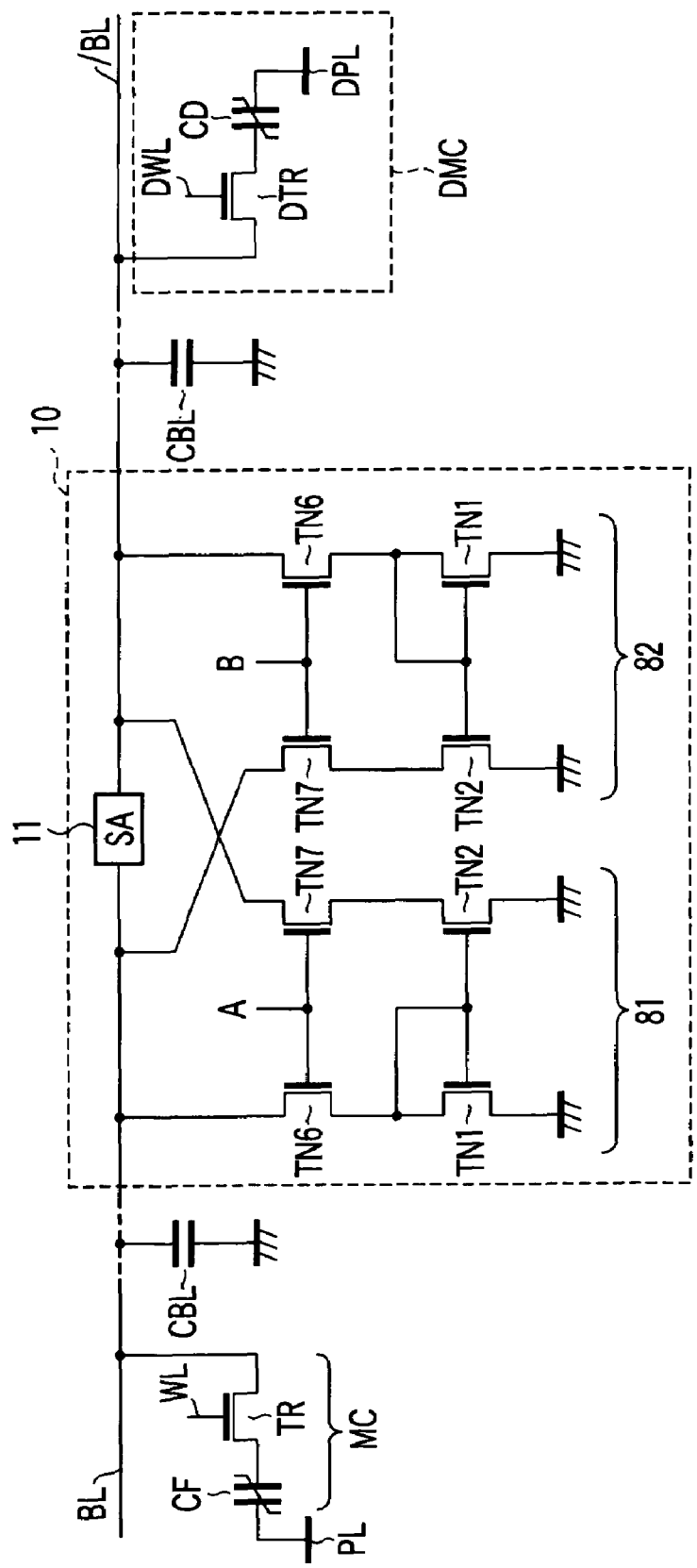
FIG. 7 is a circuit diagram showing a modification example of the ferroelectric memory device shown in FIG. 6.

FIG. 7 shows a modification example of the memory device shown in FIG. 6. A data read circuit 10 is provided with first and second current mirror circuits 81 and 82. The first and second current mirror circuits 81 and 82 each include four NMOS transistors TN1, TN2, TN6 and TN7. The gate of the transistors TN1 and TN2 is connected in common, and the drain and gate of the transistor TN1 is short-circuited, like the case of FIG. 1. The gate of the transistors TN6 and TN7 in the first current mirror circuit 81 is supplied with the control signal A. The gate of the transistors TN6 and TN7 in the second current mirror circuit 82 is supplied with the control signal B.

In the memory device of FIG. 7, the foregoing two current mirror circuits 81 and 82 is operated in accordance with two control signals A and B. In other words, the memory device of FIG. 7 is operated in the same manner as the memory device of FIG. 6.

When the bit line BL is used as a read bit line while the bit line /BL is used as a reference bit line, the control signal A is set to "H" while the control signal B is set to "L". In the first current mirror circuit 81, the transistors TN6 and TN7 are driven on. On the other hand, the second current mirror circuit 82, the transistors TN6 and TN7 are driven off. By doing so, the first current mirror circuit 81 is operated, and the same current as carried from the read bit line BL is carried to the first current mirror circuit 81 from the reference bit line /BL.

Conversely, when the bit line /BL is used as a read bit line while the bit line BL is used as a reference bit line, the control signal A is set to "L" while the control signal B is set to "H". In the first current mirror circuit 81, the transistors TN6 and TN7 are driven off. On the other hand, the second current mirror circuit 82, the transistors TN6 and TN7 are driven on. By doing so, the second current mirror circuit 82 is operated, and the same current as carried from the read bit line /BL is carried to the second current mirror circuit 82 from the reference bit line BL.

Incidentally, when the sense amplifier 11 is in an operation mode and in a standby mode, both control signals A and B are set to "L", and the transistors TN6 and TN7 are both driven off. Thus, the bit lines BL and /BL are separated from the GND node.

FOURTH EMBODIMENT

Figure 8:
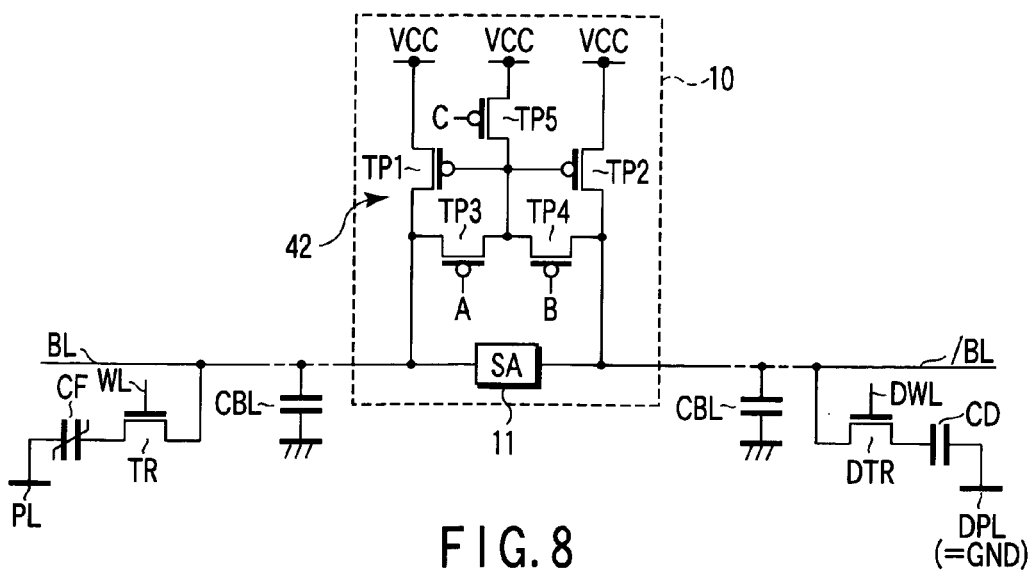
FIG. 8 is a circuit diagram of a ferroelectric memory device according to a fourth embodiment of the present invention.

FIG. 8 shows a memory device according to a fourth embodiment of the present invention. In the memory device of the fourth embodiment, a read method based on the same concept as the memory device of the second embodiment is employed. The memory device of the fourth embodiment differs from that of the second embodiment in the following point. The paired bit lines BL and /BL is pre-charged to "H" before data read, and in the data read start, cell plate line PL and dummy cell plate line DPL are held at GND voltage. For this reason, the current mirror circuit provided in the data read circuit 10 is formed using PMOS transistors. The data read circuit shown in FIG. 8 differs from that shown in FIG. 4 in the configuration of the current mirror circuit, that is, the channel type of transistor, and connection voltage node.

A current mirror circuit 42 shown in FIG. 8 includes first to fifth PMOS transistors TP1 to TP5. The drain-source current path of the first PMOS transistor TP1 is connected between one bit line BL and a power supply voltage (VCC) node. The drain-source current path of the second PMOS transistor TP2 is connected between the other bit line /BL and a power supply voltage (VCC) node. The gate of the first and second PMOS transistors TP1 and TP2 is connected in common. The drain-source current path of the third PMOS transistor TP3 is connected between one bit line BL and a gate common connection node of the first and second PMOS transistors TP1 and TP2. The drain-source current path of the fourth PMOS transistor TP4 is connected between the other bit line /BL and the gate common connection node of the first and second PMOS transistors TP1 and TP2. The drain-source current path of the fifth PMOS transistor TP5 is connected between the gate common connection node of the first and second PMOS transistors TP1 and TP2 and the power supply voltage (VCC) node. The gate of the third PMOS transistor TP3 is supplied with the first control signal A. The gate of the fourth PMOS transistor TP4 is supplied with the second control signal B. The gate of the fifth PMOS transistor TP5 is supplied with the third control signal C.

FIG. 9 is a timing waveform chart of principal signals in the memory device shown in FIG. 8. The operation of the memory device shown in FIG. 8 will be described below with reference to FIG. 9. The sense amplifier 11 compares and amplifies the following bit line voltages. One is a bit line voltage depending on a signal read from the memory cell MC connected to one bit line BL. Another is a bit line voltage depending on the reference voltage generated by the dummy memory cell DMC connected to the other bit line /BL.

The operation of the current mirror circuit 42 will be schematically described below. The paired bit lines BL and /BL are both pre-charged to "H". When data read is started, cell plate line PL and dummy cell plate line DPL are held at GND voltage.

When the bit line BL is used as a read bit line while the bit line /BL is used as a reference bit line, the transistor TP3 is driven on while transistors TP4 and TP5 are driven off according to the foregoing control signals A, B and C. By doing so, the same current as carried to the read bit line BL from the current mirror circuit 42 is carried to the reference bit line /BL from the current mirror circuit 42.

Conversely, when the bit line /BL is used as a read bit line while the bit line BL is used as a reference bit line, the transistor TP4 is driven on while transistors TP3 and TP5 are driven off according to the foregoing control signals A, B and C. By doing so, the same current as carried to the reference bit line /BL from the current mirror circuit 42 is carried to the read bit line BL from the current mirror circuit 42. Incidentally, when the sense amplifier 11 is in an operation mode and the device is in a standby mode, the transistor TP5 is driven on while transistors TP3 and TP4 are driven off according to the foregoing control signals A, B and C. By doing so, the transistors TP1 and TP2 are driven off; therefore, the bit line pair BL and /BL are separated from the VCC node.

In order to rewrite data to the ferroelectric capacitor of the selected memory cell, the cell plate line PL is set to "H" after the amplified output of the sense amplifier 11 is determined during the "H" period of the word line WL and dummy word line DWL.

MODIFICATION EXAMPLE OF FOURTH EMBODIMENT

FIG. 10 shows a modification example of the memory device shown in FIG. 8. A current mirror circuit 52 shown in FIG. 10 differs from the current mirror circuit 42 shown in FIG. 8 in the circuit configuration for driving off transistors TP1 and TP2. More specifically, the drain-source current path of the PMOS transistor TP6 is connected between the bit line BL and the drain of the transistor TP1. The drain-source current path of the PMOS transistor TP7 is connected between the bit line /BL and the drain of the transistor TP2. Each gate of the transistors TP6 and TP7 is supplied with the control signal C.

In the memory device of FIG. 10, when the bit line BL is used as a read bit line while the bit line /BL is used as a reference bit line, the transistors TP3, TP6 and TP7 are each driven on while transistors TP4 is driven off according to the foregoing control signals A, B and C. By doing so, the drain-gate of the first PMOS transistor TP1 is short-circuited. Thus, the same current as carried to the read bit line BL from the current mirror circuit 52 is carried to the reference bit line /BL from the current mirror circuit 52.

Conversely, when the bit line /BL is used as a read bit line while the bit line BL is used as a reference bit line, the transistors TP4, TP6 and TP7 are each driven on while transistor TP3 is driven off according to the foregoing control signals A, B and C. By doing so, the same current as carried to the read bit line /BL from the current mirror circuit 52 is carried to the reference bit line BL from the current mirror circuit 52.

Incidentally, when the sense amplifier 11 is in an operation mode and the device is in a standby mode, the transistors TP6 and TP7 are driven off according to the control signal C. By doing so, the bit lines BL and /BL are separated from the power supply voltage VCC node.

FIFTH EMBODIMENT

FIG. 11 shows a memory device according to a fifth embodiment of the present invention. A data read circuit 10 is provided with first and second current mirror circuits 121 and 122. The first current mirror circuit 121 carries the same current as carried from the bit line BL to the bit line /BL. On the other hand, the second current mirror circuit 122 carries the same current as carried from the bit line /BL to the bit line BL.

The first current mirror circuit 121 includes four PMOS transistors TP1, TP2, TP3 and TP5. The gate of the transistor TP3 is supplied with the control signal A. The gate of the transistor TP5 is supplied with an inverted signal /A of the control signal A.

The second current mirror circuit 122 includes four PMOS transistors TP1, TP2, TP4 and TP5. The gate of the transistor TP4 is supplied with the control signal B. The gate of the transistor TP5 is supplied with an inverted signal /B of the control signal B.

In the memory device of FIG. 11, one of the foregoing two current mirror circuits 121 and 122 is operated in accordance with two control signals A and B.

When the bit line BL is used as a read bit line while the bit line /BL is used as a reference bit line, the control signal A is set to "L" while the control signal B is set to "H". In the first current mirror circuit 121, the transistor TP3 is driven on while the transistor TP5 is driven off. On the other hand, the second current mirror circuit 122, the transistor TP4 is driven off while the transistor TP5 is driven on. By doing so, the first current mirror circuit 121 is operated, and the same current as carried to the read bit line BL is carried to the reference bit line /BL from the first current mirror circuit 121.

Conversely, when the bit line /BL is used as a read bit line while the bit line BL is used as a reference bit line, the control signal A is set to "H" while the control signal B is set to "L". In the first current mirror circuit 121, the transistor TP3 is driven off while the transistor TP5 is driven on. On the other hand, the second current mirror circuit 122, the transistor TP4 is driven on while the transistor TP5 is driven off. By doing so, the second current mirror circuit 122 is operated, and the same current as carried to the read bit line /BL is carried to the reference bit line BL from the second current mirror circuit 122.

Incidentally, when the sense amplifier 11 is in an operation mode and the device is in a standby mode, both control signals A and B are set to "H". In the first and second current mirror circuits 121 and 122, the transistors TP3 and TP4 are both driven off while the transistors TP5 are driven on. Thus, the bit lines BL and /BL are separated from the power supply voltage node in the first and second current mirror circuits 121 and 122.

According to the fifth embodiment, the paired transistors TP1 and TP2 included in the current mirror circuits 121 and 122 may differ from each other in its size, thereby obtaining gain.

For example, when the channel width of the transistor TP2 is set to n times as wide as that of the transistor TP1, in the data read operation, the charge carried to the reference bit line from the current mirror circuit is amplified to n times as much as that carried to the read bit line. Therefore, this serves to widen the setting margin in the capacitance value of the dummy capacitor CD and the voltage of the dummy cell plate line DPL.

MODIFICATION EXAMPLE OF FIFTH EMBODIMENT

Figure 12:
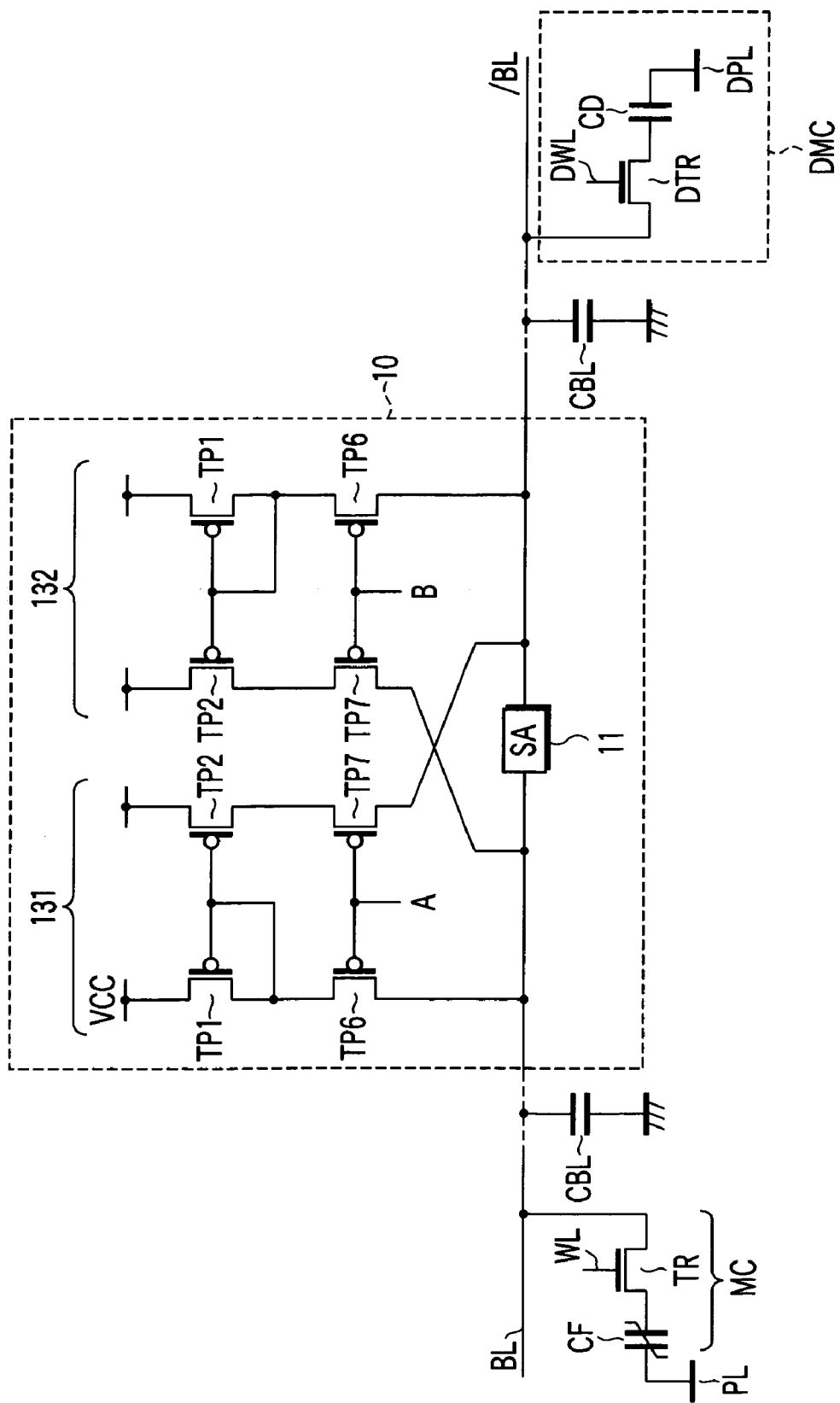
FIG. 12 is a circuit diagram showing a modification example of the ferroelectric memory device shown in FIG. 11.

FIG. 12 shows a modification example of the memory device shown in FIG. 11. A data read circuit 10 is provided with first and second current mirror circuits 131 and 132. The first and second current mirror circuits 131 and 132 each include four PMOS transistors TP1, TP2, TP6 and TP7. The gate of the transistors TP1 and TP2 is connected in common, and the drain and gate of the transistor TP1 is short-circuited. The gate of the transistors TP6 and TP7 in the first current mirror circuit 131 is supplied with the control signal A. The gate of the transistors TP6 and TP7 in the second current mirror circuit 132 is supplied with the control signal B.

In the memory device of FIG. 12, one of the foregoing two current mirror circuits 131 and 132 is operated in accordance with two control signals A and B.

When the bit line BL is used as a read bit line while the bit line /BL is used as a reference bit line, the control signal A is set to "L" while the control signal B is set to "H". In the first current mirror circuit 131, the transistors TP6 and TP7 are driven on. On the other hand, the second current mirror circuit 132, the transistors TP6 and TP7 are driven off. By doing so, the first current mirror circuit 131 is operated, and the same current as carried from the read bit line BL is carried to the reference bit line /BL from the first current mirror circuit 131.

Conversely, when the bit line /BL is used as a read bit line while the bit line BL is used as a reference bit line, the control signal A is set to "H" while the control signal B is set to "L". In the first current mirror circuit 131, the transistors TP6 and TP7 are driven off. On the other hand, the second current mirror circuit 132, the transistors TP6 and TP7 are driven on. By doing so, the second current mirror circuit 132 is operated, and the same current as carried from the read bit line /BL is carried to the reference bit line BL from the second current mirror circuit 132.

Incidentally, when the sense amplifier 11 is in an operation mode and the device is in a standby mode, both control signals A and B are set to "H", and the transistors TP6 and TP7 are both driven off. Thus, the bit lines BL and /BL are separated from the power supply voltage Vcc node.

The foregoing embodiments have explained about the case where the present invention is applied to a general-purpose ferroelectric memory device. The present invention is applicable to a semiconductor integrated circuit having a ferroelectric memory cell array.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric random access memory device comprising:
    a memory cell array having a plurality of ferroelectric memory cells in a matrix, each including a transistor for charge transfer gate;
    a first bit line connected to one terminals of the plurality of ferroelectric memory cells;
    a word line connected to gates of the transistors of the plurality of ferroelectric memory cells;
    a cell plate line connected to the other terminals of the plurality of ferroelectric memory cells;
    a second bit line paring with the first bit line;
    a reference voltage supply circuit connected to the second bit line, and supplying a reference voltage to the second bit line; and
    a data read circuit connected to the first and second bit lines,
    the data read circuit including:
    a sense amplifier having a pair of sense nodes connected to the first and second bit lines, and comparing and amplifying each voltage of the first and second bit lines; and
    a current mirror circuit having a pair of current input nodes or a pair of current output nodes connected to the first and second bit lines, and carrying the same current flowing through one of the first and second bit lines to the other bit line.

2. The device according to claim 1, wherein the operation of the current mirror circuit is stopped when the sense amplifier is in an operation mode and the device is in a standby mode.

3. The device according to claim 1, wherein the current mirror circuit includes:
    a first MOS transistor having a drain-source current path connected between the first bit line and a first voltage node;
    a second MOS transistor having a drain-source current path connected between the second bit line and the first voltage node, and a gate connected to a gate of the first MOS transistor;
    a third MOS transistor having a drain-source current path connected between the first bit line and the gate of the first MOS transistor, and a gate supplied with a first control signal;
    a fourth MOS transistor having a drain-source current path connected between the second bit line and the gate of the second MOS transistor, and a gate supplied with a second control signal; and a fifth MOS transistor having a drain-source current path connected between a gate common connection node of the first and second MOS transistors and the first voltage node, and a gate supplied with a third control signal.

4. The device according to claim 3, wherein the first to fifth MOS transistors are each an N-channel transistor, and the first voltage node is a ground voltage node.

5. The device according to claim 3, wherein the first to fifth MOS transistors are each a P-channel transistor, and the first voltage node is a power supply voltage node.

6. The device according to claim 1, wherein the current mirror circuit includes:
a first MOS transistor having a drain-source current path connected between the first bit line and a first voltage node;
a second MOS transistor having a drain-source current path connected between the second bit line and the first voltage node, and a gate connected to a gate of the first MOS transistor;
a third MOS transistor having a drain-source current path connected between a drain and a gate of the first MOS transistor, and a gate supplied with a first control signal;
a fourth MOS transistor having a drain-source current path connected between a drain and a gate of the second MOS transistor, and a gate supplied with a second control signal;
a fifth MOS transistor having a drain-source current path connected between the first bit line and the drain of the first MOS transistor, and a gate supplied with a third control signal; and
a sixth MOS transistor having a drain-source current path connected between the second bit line and the drain of the second MOS transistor, and a gate supplied with a third control signal.

7. The device according to claim 6, wherein the first to sixth MOS transistors are each an N-channel transistor, and the first voltage node is a ground voltage node.

8. The device according to claim 6, wherein the first to sixth MOS transistors are each a P-channel transistor, and the first voltage node is a power supply voltage node.

9. The device according to claim 1, wherein the current mirror circuit includes:
a first current mirror circuit carrying the same current as flowing through the first bit line to the second bit line; and
a second current mirror circuit carrying the same current as flowing through the second bit line to the first bit line,
one of the first and second current mirror circuits being selectively operated according to a plurality of control signals when data is read from the memory cell to the first bit line.

10. The device according to claim 9, wherein the first current mirror circuit includes:
a first MOS transistor having a drain-source current path connected between the first bit line and a first voltage node;
a second MOS transistor having a drain-source current path connected between the second bit line and the first voltage node, and a gate connected to a gate of the first MOS transistor;
a third MOS transistor having a drain-source current path connected between the first bit line and the gate of the first MOS transistor, and a gate supplied with a first control signal; and
a fourth MOS transistor having a drain-source current path connected between a gate common connection node of the first and second MOS transistors and a ground node, and a gate supplied with an inverted signal of the first control signal,
the second current mirror circuit includes:
a fifth MOS transistor having a drain-source current path connected between the second bit line and the first voltage node;
a sixth MOS transistor having a drain-source current path connected between the first bit line and the first voltage node, and a gate connected to a gate of the fifth MOS transistor;
a seventh MOS transistor having a drain-source current path connected between the second bit line and the gate of the fifth MOS transistor, and a gate supplied with a second control signal; and
an eighth MOS transistor having a drain-source current path connected between a gate common connection node of the fifth and sixth MOS transistors and the first voltage node, and a gate supplied with an inverted signal of the second control signal.

11. The device according to claim 10, wherein the first to eighth MOS transistors are each an N-channel transistor, and the first voltage node is a ground voltage node.

12. The device according to claim 10, wherein the first to eighth MOS transistors are each a P-channel transistor, and the first voltage node is a power supply voltage node.

13. The device according to claim 9, wherein the first current mirror circuit includes:
a first MOS transistor having a drain-source current path connected between the first bit line and a first voltage node, and a drain and a gate connected;
a second MOS transistor having a drain-source current path connected between the second bit line and the first voltage node, and a gate connected to the gate of the first MOS transistor;
a third MOS transistor having a drain-source current path connected between the first bit line and a drain of the first MOS transistor, and a gate supplied in common with a first control signal; and
a fourth MOS transistor having a drain-source current path connected between the second bit line and a drain of the second MOS transistor, and a gate supplied in common with the first control signal,
the second current mirror circuit includes:
a fifth MOS transistor having a drain-source current path connected between the second bit line and the first voltage node, and a drain and a gate connected;
a sixth MOS transistor having a drain-source current path connected between the first bit line and the first voltage node, and a gate connected to a gate of the fifth MOS transistor;
a seventh MOS transistor having a drain-source current path connected between the second bit line and the drain of the fifth MOS transistor, and a gate supplied in common with a second control signal; and
an eighth MOS transistor having a drain-source current path connected between the first bit line and a drain of the sixth MOS transistor, and a gate supplied in common with the second control signal.

14. The device according to claim 13, wherein the first to eighth MOS transistors are each an N-channel transistor, and the first voltage node is a ground voltage node.

15. The device according to claim 13, wherein the first to eighth MOS transistors are each a P-channel transistor, and the first voltage node is a power supply voltage node.

16. A data read circuit comprising:
a sense amplifier having a pair of sense nodes connected to a first bit line supplied with data read from a ferroelectric memory cell and a second bit line supplied with a reference voltage, and comparing and amplifying each voltage of the first and second bit lines; and a current mirror circuit having a pair of current input nodes or a pair of current output nodes connected to the first and second bit lines, and carrying the same current flowing through one of the first and second bit lines to the other bit line.

17. The circuit according to claim 16, wherein the current mirror circuit includes:

a first MOS transistor having a drain-source current path connected between the first bit line and a first voltage node;

a second MOS transistor having a drain-source current path connected between the second bit line and the first voltage node, and a gate connected to a gate of the first MOS transistor;

a third MOS transistor having a drain-source current path connected between the first bit line and the gate of the first MOS transistor, and a gate supplied with a first control signal;

a fourth MOS transistor having a drain-source current path connected between the second bit line and the gate of the second MOS transistor, and a gate supplied with a second control signal; and a fifth MOS transistor having a drain-source current path connected between a gate common connection node of the first and second MOS transistors and the first voltage node, and a gate supplied with a third control signal.

18. The circuit according to claim 16, wherein the current mirror circuit includes:

a first MOS transistor having a drain-source current path connected between the first bit line and a first voltage node;

a second MOS transistor having a drain-source current path connected between the second bit line and the first voltage node, and a gate connected to a gate of the first MOS transistor;

a third MOS transistor having a drain-source current path connected between a drain and the gate of the first MOS transistor, and a gate supplied with a first control signal;

a fourth MOS transistor having a drain-source current path connected between a drain and the gate of the second MOS transistor, and a gate supplied with a second control signal;

a fifth MOS transistor having a drain-source current path connected between the first bit line and the drain of the first MOS transistor, and a gate supplied with a third control signal; and a sixth MOS transistor having a drain-source current path connected between the second bit line and the drain of the second MOS transistor, and a gate supplied with a third control signal.

19. The circuit according to claim 16, wherein the current mirror circuit includes:

a first current mirror circuit carrying the same current as flowing through the first bit line to the second bit line; and a second current mirror circuit carrying the same current as flowing through the second bit line to the first bit line, the first current mirror circuit includes:

a first MOS transistor having a drain-source current path connected between the first bit line and a first voltage node;

a second MOS transistor having a drain-source current path connected between the second bit line and the first voltage node, and a gate connected to a gate of the first MOS transistor;

a third MOS transistor having a drain-source current path connected between the first bit line and the gate of the first MOS transistor, and a gate supplied with a first control signal; and a fourth MOS transistor having a drain-source current path connected between a gate common connection node of the first and second MOS transistors and a ground node, and a gate supplied with an inverted signal of the first control signal, the second current mirror circuit includes:

a fifth MOS transistor having a drain-source current path connected between the second bit line and the first voltage node;

a sixth MOS transistor having a drain-source current path connected between the first bit line and the first voltage node, and a gate connected to a gate of the fifth MOS transistor;

a seventh MOS transistor having a drain-source current path connected between the second bit line and the gate of the fifth MOS transistor, and a gate supplied with a second control signal; and an eighth MOS transistor having a drain-source current path connected between a gate common connection node of the fifth and sixth MOS transistors and the first voltage node, and a gate supplied with an inverted signal of the second control signal.

20. The circuit according to claim 16, wherein the current mirror circuit includes:

a first current mirror circuit carrying the same current as flowing through the first bit line to the second bit line; and a second current mirror circuit carrying the same current as flowing through the second bit line to the first bit line, the first current mirror circuit includes:

a first MOS transistor having a drain-source current path connected between the first bit line and a first voltage node, and a drain and a gate connected;

a second MOS transistor having a drain-source current path connected between the second bit line and the first voltage node, and a gate connected to a gate of the first MOS transistor;

a third MOS transistor having a drain-source current path connected between the first bit line and the drain of the first MOS transistor, and a gate supplied in common with a first control signal; and a fourth MOS transistor having a drain-source current path connected between the second bit line and the drain of the second MOS transistor, and a gate supplied in common with the first control signal, the second current mirror circuit includes:

a fifth MOS transistor having a drain-source current path connected between the second bit line and the first voltage node, and a drain and a gate connected;

a sixth MOS transistor having a drain-source current path connected between the first bit line and the first voltage node, and a gate connected to a gate of the fifth MOS transistor;

a seventh MOS transistor having a-drain-source current path connected between the second bit line and the drain of the fifth MOS transistor, and a gate supplied in common with a second control signal; and an eighth MOS transistor having a drain-source current path connected between the first bit line and the drain of the sixth MOS transistor, and a gate supplied in common with the second control signal.

* * * * *